(12) United States Patent
Sivero et al.

(10) Patent No.: US 9,368,221 B2
(45) Date of Patent: Jun. 14, 2016

(54) SWITCH AND SEMICONDUCTOR DEVICE INCLUDING THE SWITCH

(71) Applicant: PS4 LUXCO S.A.R.L., Luxembourg (LU)

(72) Inventors: Stefano Sivero, Capriate S. Gervasio (IT); Chiara Missiroli, Concorezzo (IT)

(73) Assignee: PS4 LUXCO S.A.R.L., Luxembourg (LU)

( * ) Notice: Subject to any disclaimer, the term of this patent is extended or adjusted under 35 U.S.C. 154(b) by 0 days.

(21) Appl. No.: 14/493,675

(22) Filed: Sep. 23, 2014

(65) Prior Publication Data

US 2015/0009762 A1 Jan. 8, 2015

Related U.S. Application Data

(62) Division of application No. 13/463,961, filed on May 4, 2012, now Pat. No. 8,848,441.

(51) Int. Cl.
*G11C 16/22* (2006.01)
*H03K 17/10* (2006.01)
*G11C 16/12* (2006.01)
*H03K 3/356* (2006.01)

(52) U.S. Cl.
CPC ............... *G11C 16/22* (2013.01); *G11C 16/12* (2013.01); *H03K 17/102* (2013.01); *H03K 3/356182* (2013.01); *H03K 2217/0054* (2013.01); *H03K 2217/0081* (2013.01)

(58) Field of Classification Search
CPC ...... G11C 16/22; G11C 16/12; H03K 17/102; H03K 3/356182; H03K 2217/0081; H03K 2217/0054
See application file for complete search history.

(56) References Cited

U.S. PATENT DOCUMENTS

| | | | | |
|---|---|---|---|---|
| 6,163,199 | A * | 12/2000 | Miske et al. | 327/434 |
| 6,911,860 | B1 * | 6/2005 | Wang et al. | 327/404 |
| 8,004,340 | B2 * | 8/2011 | Guo et al. | 327/333 |
| 8,581,656 | B2 * | 11/2013 | Curatolo | 327/427 |
| 2006/0001480 | A1 * | 1/2006 | Barkley et al. | 327/541 |
| 2011/0279179 | A1 * | 11/2011 | Vice | 330/127 |

* cited by examiner

*Primary Examiner* — Richard Elms
*Assistant Examiner* — Ajay Ojha
(74) *Attorney, Agent, or Firm* — Kunzler Law Group, PC (57) ABSTRACT

A device for use with non-volatile memory, includes a first transistor of a first channel type coupled between first and second nodes, including a control gate supplied with a first control signal having a first phase, a second transistor of a second channel type different from the first channel type including a first terminal coupled to the first node, a second terminal coupled to a third node, a back gate coupled to the first terminal thereof, and a control gate supplied with a second control signal having a second phase substantially opposite to the first phase, a third transistor of the second channel type including a first terminal coupled to the second node, a second terminal coupled to the third node, a back gate coupled to the first terminal thereof, and a control gate supplied with the second control signal, and a protection circuit coupled between the first and second node.

9 Claims, 9 Drawing Sheets

SWITCH AND SEMICONDUCTOR DEVICE INCLUDING THE SWITCH

RELATED APPLICATION

This application is a Divisional Application of U.S. patent application Ser. No. 13/463,961, which was filed on May 4, 2012, and is incorporated by reference herein.

BACKGROUND OF THE INVENTION

1. Field of the Invention

The present invention relates to a switch (e.g., ultra-high voltage switch), and more particularly, a switch which may include a low-threshold pass system and a level shifter (e.g., including a cascoded multi-latch architecture) for controlling the low-threshold pass system.

2. Description of the Related Art

In NAND memories, a high voltage (e.g., 20V or more) may be passed through a switch array in order to bias word-lines or other generic nodes in the array during read or modify operations. However, this may cause the devices (e.g., transistors) used in NAND memories to at times exceed the limit of a Safe Operating Area (SOA).

That is, during standard operations (read, program, erase) these devices may face voltages that could be greater than the maximum allowed voltage across gate oxide and drain-bulk or source-bulk junctions of the device, or more restrictively, along the channel (i.e., drain-source junction) of the device when the device is turned on and drains current. If this occurs, then the reliability of the entire system would be compromised or, in some cases, the device could be definitively damaged because of huge breakdown currents across the above-mentioned junctions.

Another issue that is very common for NAND memories, is related to the lack of a p-ch device with the capability of sustaining ultra-high voltages across the drain-bulk junction, source-bulk junction, and/or drain-source junction (hereinafter referred to collectively as "source/drain/bulk junctions"). Only n-ch devices with these characteristics are usually available, and these devices usually have high threshold voltage values, a parameter that is directly related to the need for sustaining very high voltages.

On the other hand, technology often offers n-ch devices capable of sustaining very high voltages across junctions, but with a threshold voltage which could be quite null or even negative, so that the devices are totally inadequate to be used as a switch.

In short, it could happen that a voltage greater than the maximum voltage allowed by the SOA of the available devices shall be dealt with during read or modify operations, and hence a very accurate architecture for switches is needed in order to manage the high voltages.

Conventionally, this is achieved in some cases with pumped switches basically made of a single stage of a charge pump.

Figure 1:
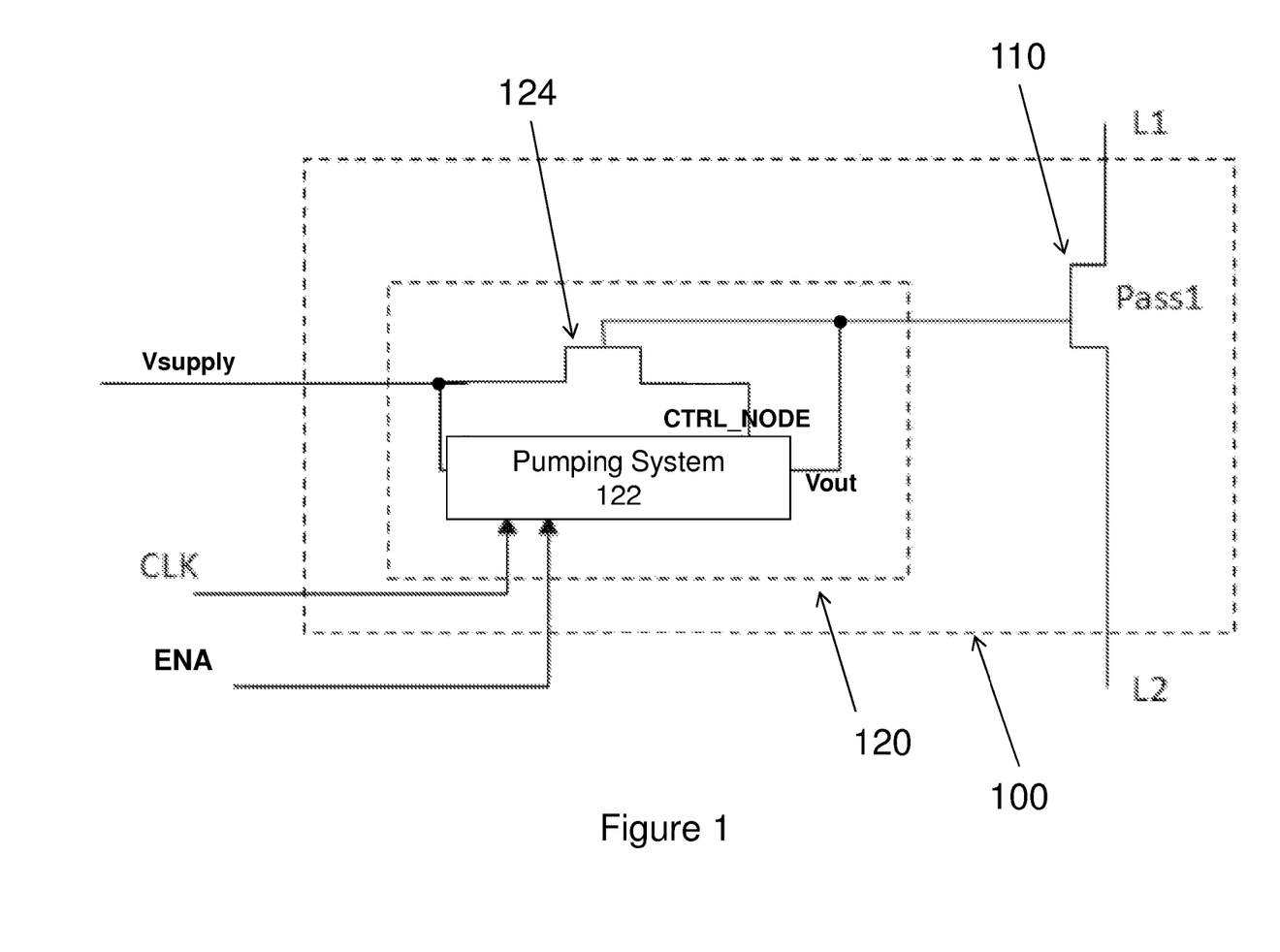
FIG. 1 illustrates a related art pumped switch 100.

FIG. 1 illustrates a related art pumped switch 100.

As illustrated in FIG. 1, the related art pumped switch 100 includes a transistor 110 (e.g., Pass1 transistor) that connects line L1 to line L2, and a pump device 120 which controls the transistor 110. The pump device 120 includes a pumping system 122 which receives a clock signal CLK and an enable signal ENA, and outputs a voltage Vout. The pump device 120 also includes an n-ch transistor 124 coupled to the pumping system 122, to supply voltage Vsupply and to a control node CTRL-NODE. The gate of the transistor 110 is coupled to Vout and to the gate of the n-channel transistor 124.

The n-channel transistor 124 can sustain voltages up to 30V (for instance, depending on technology) across gate oxide and drain/bulk or source/bulk junctions, and up to 15V (e.g., depending on technology) along the channel when the transistor 124 is turned on. The transistor 124 receives at one of its terminals (e.g., drain terminal) a high voltage ($V_{SUPPLY}$). The clocking system is turned "on" and the gate of the transistor 124 (which has a threshold voltage Vth) is finally pumped to a voltage ($V_{SUPPLY}$+Vth) which is high enough to let $V_{SUPPLY}$ be passed on the source side of the transistor 124 (indicated as CTRL_NODE in FIG. 1).

Thus, when the regime is reached, the voltage V(CTRL_NODE) at the source terminal of the transistor 124 is given by V(CTRL_NODE)=$V_{SUPPLY}$, and the gate voltage Vout at the gate of transistor 124 is given by Vout=$V_{SUPPLY}$+Vth. The gate voltage Vout of the transistor 124 is applied to the gate of the transistor 110 (e.g., pass transistor) that connects the line L1 to the line L2, activating the transistor 110 so that a short between the two lines L1, L2 is ensured and a voltage on line L1 as high as $V_{SUPPLY}$ can be passed on line L2.

SUMMARY OF THE INVENTION

According to an embodiment, a device includes a first transistor coupled between first and second nodes, and including a control gate supplied with a first control signal, a second transistor coupled between the first node and a third node, and including a control gate supplied with the first control signal, a third transistor coupled between the third node and a fourth node, and including a control gate supplied with a second control signal, a fourth transistor coupled between the fourth node and a fifth node, and including a control gate supplied with the second control signal, and a fifth transistor coupled between the fifth node and the second nodes, and including a control gate supplied with the first control signal, each of the first, second, and fifth transistors being of a first channel type, each of the third and fourth transistors being of a second channel type, the first and second channel types being different from each other, and each of the second and fifth transistors being smaller in threshold voltage than the first transistor.

According to another embodiment, a device includes a non-volatile memory array, an internal line coupled to the non-volatile memory array, a voltage line configured to take at least first and second voltage levels in a program of the non-volatile memory array, the first and second voltage levels being different from each other, a first circuit configured to produce a first electrical path from the voltage line to the internal line, a second circuit configured to produce a second electrical path connecting from the voltage line to the internal line, the first electrical path being produced and the second electrical path being not produced when the voltage line takes the first voltage level, and both of the first and second electrical paths being produced when the voltage line take the second voltage level.

According to still another embodiment, a device includes a first transistor of a first channel type coupled between first and second nodes, including a control gate supplied with a first control signal having a first phase, a second transistor of a second channel type different from the first channel type including a first terminal coupled to the first node, a second terminal coupled to a third node, a back gate coupled to the first terminal thereof, and a control gate supplied with a second control signal having a second phase substantially opposite to the first phase, a third transistor of the second channel type including a first terminal coupled to the second node, a second terminal coupled to the third node, a back gate coupled to the first terminal thereof, and a control gate supplied with the second control signal, and a protection circuit coupled between the first and second node so that the protection circuit, the second transistor and the third transistor are connected in series, the protection circuit being supplied with the first control signal.

DETAILED DESCRIPTION OF EXEMPLARY EMBODIMENTS OF THE INVENTION

Referring now to the drawings, FIGS. 2-7 illustrate exemplary aspects of the present invention.

The main drawbacks of conventional devices such as the related art pumped switch 100 described above include:

1. The whole structure (e.g., pumped switch 100) occupies a very large area;

2. The gate voltage on the gate of the transistor 110 (because of high value of Vth threshold voltage) may be too high to effectively pass a high voltage Vin on line L1 to line L2, without any voltage drop on the transistor 110. In some cases it could happen that the gate voltage V(G) is greater than the maximum allowed voltage on gate oxide of transistor 110, and the switch 100 hence could not work properly and safely;

3. A huge power consumption from the voltage source which generates $V_{SUPPLY}$ (e.g., an external power supply);

4. Need of a charge pump/voltage regulator and oscillator to feed the switch (area occupation);

5. Layout concerns for routing the line connecting the gate of transistor 110 and the gate of transistor 124. If parasitic capacitance is high, then the pumping of the pump device 120 is compromised, in term of rising timings; and 6. Turning on/off concerns: rise time is limited by parasitical caps on Vout node and by efficiency of the pumping system of the switch, and hence by charge pump/oscillator that feed Vpump and CLK lines. Moreover, the turning off is critical because during all the phase the SOA of internal devices shall be respected.

The exemplary aspects of the present invention may address the above-mentioned issues at once.

Generally, an exemplary aspect of the present invention is directed to a switch including (e.g., constituted by) a low-threshold pass system and a level shifter which may control the low-threshold pass system. In particular, the level shifter may include a triple latch and a double cascode architecture, which may be used in NAND memory, along the High Voltage paths that bias the wordlines, the bitlines and the array elements in a more general way during read and modify operations.

The proposed switch architecture may drastically reduce the area occupation on chip and the power consumption during operations. The switch may also ensures the respect of the Safe Operating Area (SOA) limits of the devices that it's comprised of, being p-ch and n-ch devices, and has not particular layout concerns. Finally, the timings during turning on and off phases are relaxed with respect to the widely used pumped switches.

An exemplary aspect of the present invention is directed to a switch (e.g., an Ultra-High Voltage switch) that may be used to pass very high voltages (in the range of 20V and over) in a NAND memory, the switch being constituted by a low-threshold pass system and a level shifter having a architecture that drastically reduces area and power consumption, and that can be easily driven during memory operations, without time wasting during turning on and off transistors and with no particular layout concerns.

Figure 2:
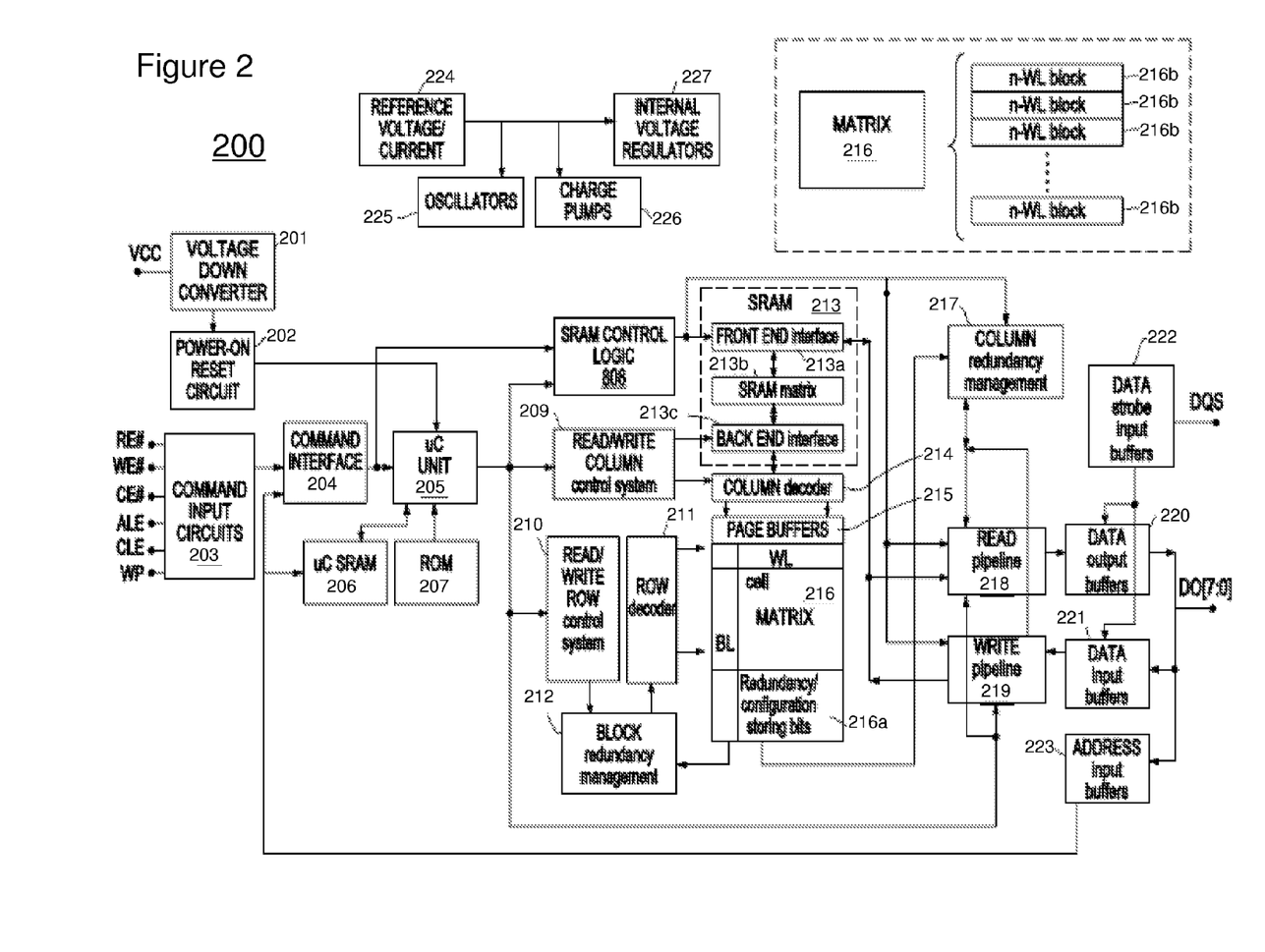
FIG. 2 illustrates a block scheme of a semiconductor memory device 200 (e.g., NAND memory) according to an exemplary aspect of the present invention.

FIG. 2 illustrates a block scheme of a semiconductor memory device 200 (e.g., NAND memory) according to an exemplary aspect of the present invention. It should be noted that the exemplary aspects of the present invention (e.g., switch 300 in FIG. 3A or switch 350 in FIG. 3B) may be formed (e.g., implemented) in the Read/Write Column control system 209, and/or the Read/Write Row control system 210 of memory device 200 in FIG. 2. However, in general, the exemplary aspects of the present invention can be used in any place where a high voltage is passed through a switch system.

As illustrated in FIG. 2, the memory device 200 includes a voltage down converter 201 which is connected to a power supply (VCC), and a power-on reset circuit 202. The device 200 also includes a command input circuit 203 which is coupled to synchronization pads for receiving a read enable signal (RE#), a write enable signal (WE#), and a chip enable signal (CE#), and is connected to control pads for receiving an address latch enable signal (ALE) and a command latch enable signal (CLE), and is connected to a pad for receiving a write protect signal (WP). The device also includes a command interface 204 which is connected to the command input circuit 203.

The command interface 204 and the power-on reset circuit 202 are connected to a microcontroller unit 205, and a microcontroller RAM 206 and ROM 207 are accessible by the microcontroller unit 205.

The device 200 includes SRAM control logic 208 which receives an output of the command interface 204 and the microcontroller unit 205, and also includes read/write column control system 209 and read/write row control system 210 which receive an output of the microcontroller unit 205.

The device 200 also includes row decoder 211, column decoder 214 and page buffers 215 which are connected to the matrix 216 (e.g., memory array). The memory array 216 includes redundancy/configuration storing bits 216a and a plurality of memory blocks 216b (e.g., n-WL blocks). The matrix 216 is also connected to block redundancy management 212 and column redundancy management 217.

The device 200 includes a read pipeline 218 which is connected to the column redundancy management 217 and the front end interface 213a of the SRAM 213, and receives an output of the SRAM control logic 208, and an output of the microcontroller unit 205. The device 200 also includes a write pipeline 219 which is connected to the front end interface 213a of the SRAM 213 and receives an output of the SRAM control logic 208 and an output of the microcontroller unit 205.

The device 200 also includes data output buffers 220 which receive data which is output of the read pipeline 218 and data input buffers 221 which input data to the write pipeline 219. The device 200 also includes data strobe input buffers 222 which are connected to the data output buffers 220 and the data input buffers 221, and address input buffers 223 which input an address to the command interface 204 and the microcontroller SRAM 206. The data output buffers 220, data input buffers 221, data strobe input buffers 222 and address input buffers 223 are connected to data pads (DQ) for inputting data to the device 200 and outputting data from the device 200.

The device 200 also includes a reference voltage/current generator 224, and oscillators 225, charge pumps 226 and internal voltage regulators 227 which receive an output of the reference voltage/current generator 224.

Further, the various signals (e.g., VCC, RE#, WE#, CE#, ALE, CLE, WP and DQ) which may be used in the present invention may be generated by a digital processing apparatus (e.g., computer, cellular phone, etc.). For example, the device 200 in FIG. 2 may be connectable (e.g., fixedly connectable, removably connectable, wirelessly connectable, etc.) to such a digital processing apparatus via the pads for receiving VCC, RE#, WE#, CE#, ALE, CLE, WP and DQ which are illustrated in FIG. 2.

Figure 3A:
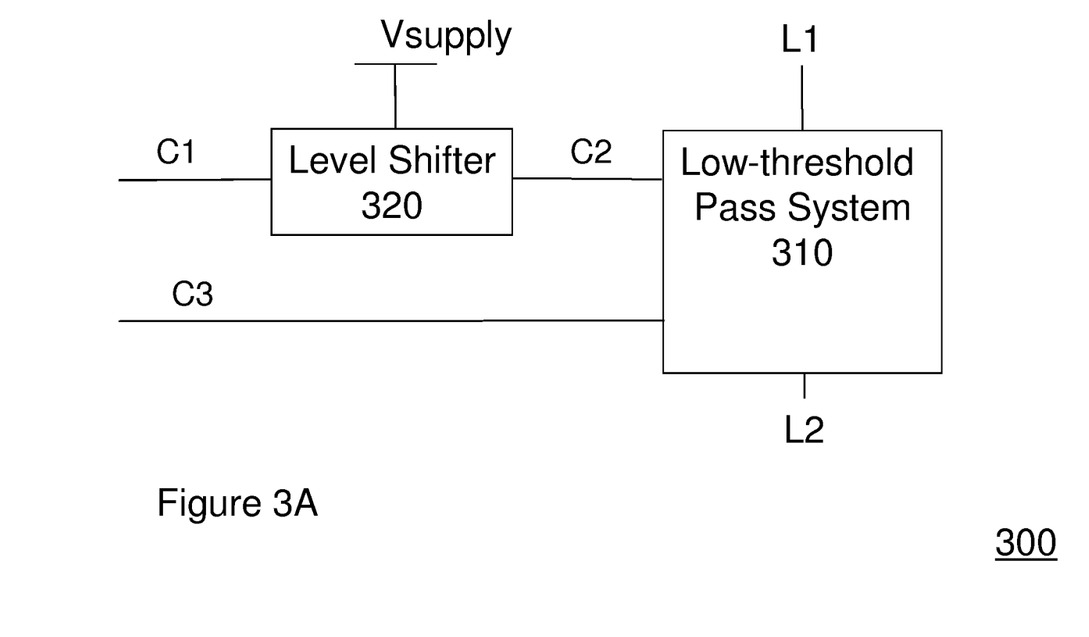
FIG. 3A illustrates a basic scheme including a switch 300, according to an exemplary aspect of the present invention.

FIG. 3A illustrates a basic scheme including a switch 300, according to an exemplary aspect of the present invention. As illustrated in FIG. 3A, the switch 300 includes a low-threshold pass system 310 and a level shifter 320 to drive the low-threshold pass system 310. The level shifter 320 receives a supply voltage Vsupply and a control signal C1 (e.g., a selection signal such as ENA), and outputs a control signal C2 to the low-threshold pass system 310 for controlling an operation of the low-threshold pass system 310 (e.g., controlling a first set of transistors in the low-threshold pass system 310). The low-threshold pass system 310 may also receive a control signal C3 for controlling an operation of the low-threshold pass system 310 (e.g., controlling a second set of transistors in the low-threshold pass system 310).

The switch 300 allows lines L1 and L2 to be shorted so that if L1 is biased at a voltage VA, then VA can be effectively passed to line L2. This is achieved by means of the low-threshold pass system 310 which is driven by the level shifter 320 supplied by Supply voltage $V_{SUPPLY}$.

In particular, the control signal C1 (e.g., selection signal) may be configured to take a first level (e.g., Vpwr) or a second level (e.g., ground), the first level being taken to produce an electrical path between lines L1 and L2, and the second level being taken to not produce the electrical path between the lines L1 and L2.

The combination of the level shifter 320 and low-threshold pass system 310 may be considered a significant improvement over the pump device 120 and simple Pass1 transistor 110 in the related art pumped switch 100. In particular, the pass-system 310 represented in FIG. 3A may be considered significant improvement over the simple Pass1 transistor 110 in the related art pumped switch 100.

Figure 3B:
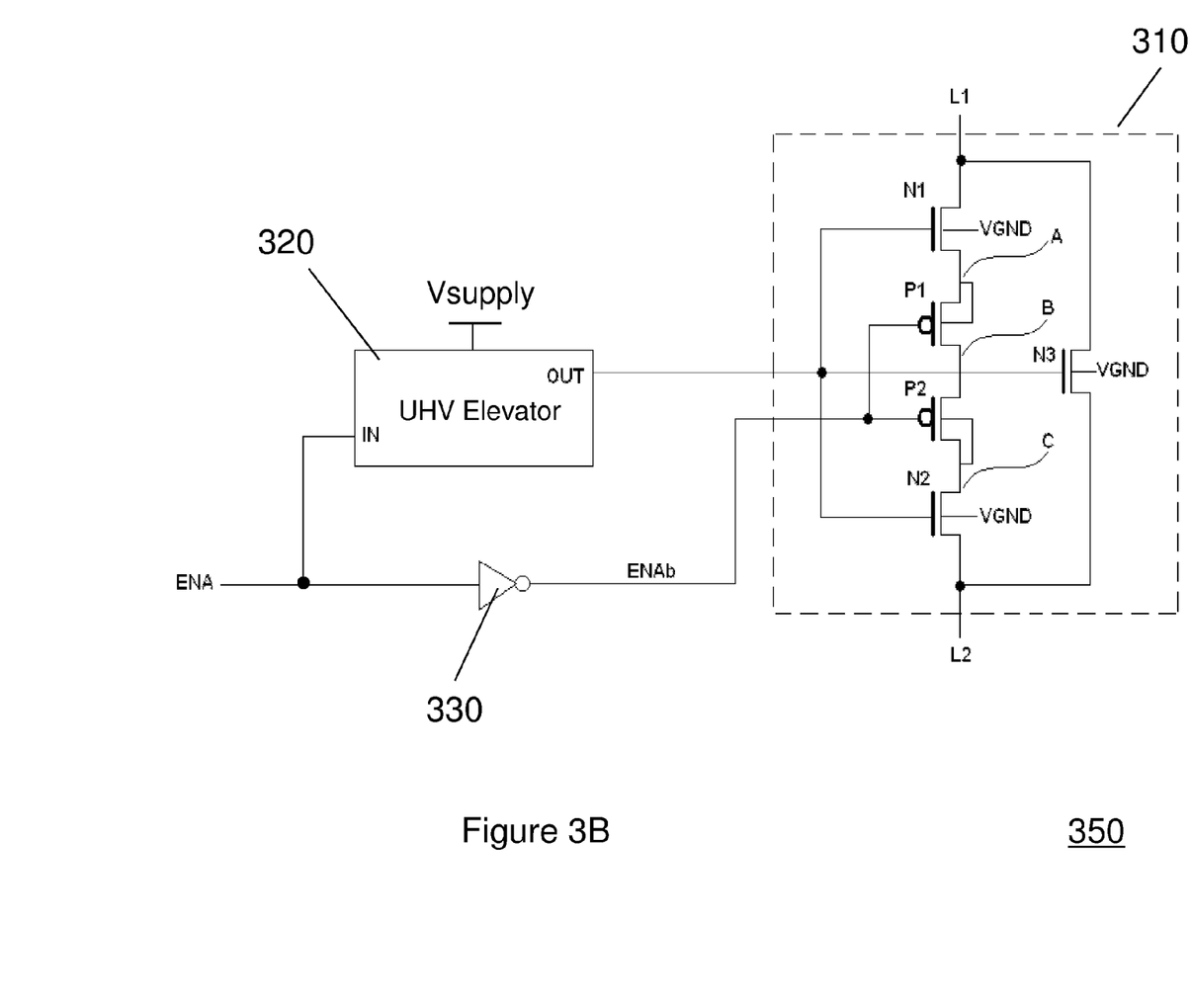
FIG. 3B illustrates a switch 350 according to another exemplary aspect of the present invention.

FIG. 3B illustrates a switch 350 according to another exemplary aspect of the present invention.

As illustrated in FIG. 3B, in the switch 350, the low-threshold pass system 310 may include transistors N1, P1, P2, N2 and N3 which are driven by the level shifter 320 (e.g., ultra-high voltage (UHV) elevator) supplied by Supply voltage $V_{SUPPLY}$. The level shifter 320 may also include an input node which receives an enable signal ENA (e.g., selection signal) for enabling the level shifter 320, and an output node OUT which outputs a signal for controlling an operation of the low-threshold pass system 310. The switch 350 may also include an inverter 330 which inverts the enable signal ENA, the inverted enable signal ENAb serving as a control signal for controlling an operation of the low-pass threshold system 310.

In particular, the inverted enable signal ENAb may have a phase which is substantially the opposite of the phase of the control signal from the output node OUT.

In particular, the transistors N1, N2 and N3 may be controlled by the output of the level shifter 320, and the transistors P1 and P2 may be controlled by the inverted enable signal ENAb.

Assuming that the level shifter 320 has no concerns and may be considered a black box that furnishes a voltage on the OUT node in the range from $0$-$V_{Supply}$, where $V_{Supply}$ is a voltage such that if L1 is biased at a voltage $V_A$, then $V_{Supply} > V_{A,max} + V_{th,N1}$, where $V_{A,max}$ is the maximum voltage value that can be applied to line L1 to be passed to line L2, and $V_{th,N1}$ is the maximum threshold voltage of the N1 and N2 transistors. Typical values for $V_{A,max}$ and $V_{th,N1}$ are 20V and 1V, respectively. Hence, $V_{Supply}$ shall be at least 21V to ensure the correct behavior of the low-threshold pass system 310.

Note that if the related art pumped switch 100 of FIG. 1 would be used, then for a $V_{A,max}$=20V to be passed from line L1 to L2, then the maximum gate voltage on the Pass 1 transistor would be much higher than 20V, since the gate voltage must be higher than $V_{A,max}$+threshold voltage $V_{th}$ of an n-ch (Pass1) with a high threshold, i.e. in the range of 3V-5V. This could cause infringement of SOA limits for the maximum allowed voltage on the gate oxide of Pass 1 transistor 110 in the related art pumped switch 100.

The structure of the switch 350 in FIG. 3 may allow a maximum voltage (e.g., a maximum gate voltage on the transistors in the low-threshold pass system 310) to be less than the maximum gate voltage on the Pass 1 transistor 110 in the related art pumped switch 100.

The low-threshold pass system 310 may serve as a pass-gate that can sustain very high voltages at its terminals. The n-type branch of the pass system 310 includes N3, an n-ch high-voltage type transistor with a high threshold. The p-type branch of the pass system 310 includes plural (e.g., a pair of) p-ch high-voltage type transistors P1, P2 with counter-biased bulk connections, and by plural (e.g., a pair of) high-voltage type transistors N1, N2 with low threshold (e.g., quite null or even negative), that serve as protection for the p-ch transistors P1, P2. In particular, transistors N1, N2 have a threshold voltage which is less than the threshold voltage of transistor N3. The transistors P1 and P2 are p-ch type and hence, have more restrictive SOA limits than N1 and N2 and could not likely sustain very high voltages at their junctions, even if they are in an OFF state.

Thus, N1 and N2 may serve as protection for P1 and P2 when the switch is in the OFF state. From another point of view, N1 and N2 alone cannot fulfill the requirements of a "good" switch, since N1 and N2 could have negative $V_{th}$ (e.g., when N1 and N2 have no body effect at their source/bulk junction), and so they could not be possible turned "off". As a consequence, the presence of p-ch transistors P1, P2 in series is important for effectively keeping the pass system 310 in an OFF state.

The use of plural (e.g., a pair of) p-ch transistors P1, P2 instead of a single p-ch transistor with counter-bias bulk connections derives from the circumstance that the bias of the bulk node of a p-ch transistor is usually problematic and not easily resolvable.

To better understand this point, assume that a $V_{A,max}$ voltage has to be passed from line L1 to line L2, where $V_{A,max}$ is in the voltage range above mentioned (e.g., 20V or less), and ENAb is in a range from $V_{pwr}$ to 0V. If the switch 350 is "off", then OUT node is at 0V and ENAb is at $V_{pwr}$. Further, the A and C nodes in the pass system 310 have a maximum voltage which is the minimum between $(V_{pwr}+|V_{th,P}|)$ and $|V_{th,N1}|$, where $V_{th,P}$ is the threshold voltage of P1 or P2. The p-ch type transistors such as P1 and P2 have the same threshold voltage as each other, and also the n-ch type transistors such N1 and N2 have the same threshold voltage as each other. Then both N1 and P1, or both N2 and P2 are in an "off" state and, hence, the B node in the pass system 310 is allowed to float.

In the case where the A or C nodes are coupled to some external high voltage lines running near the structure, the bulks of P1 and P2 would be correctly biased. It should be noted that a voltage level of $V_{pwr}$ in the gates of P1 and P2 suffices to keep P1 and P2 well in the "off" state, since the A and B nodes will be at maximum at the minimum between $(V_{pwr}+V_{th,P})$ and $|V_{th,N1}|$ voltage, which in any case will be lower than $V_{pwr}$.

Assuming now that the switch 350 turns "on", with the OUT node being in a range from 0 to $V_{Supply}$, and ENAb being from in a range from $V_{pwr}$ to 0V, with a voltage VA on L1 line that shall be passed on L2 line and a voltage $V_{(L2)}$ being a voltage on line L2, and with initial conditions $|V_A-V_{(L2),initial}|$<SOA limit for the drain-source voltage, in order to avoid any junction breakdown in the devices. This can be achieved by biasing L2 at an intermediate voltage before turning the switch 350 "on", or L2 could be naturally at such intermediate voltage before turning the switch 350 "on".

During the turning "on" phase, the B node is kept shorted to the C node. In fact, N1 is turned "on", $V_A$ is passed from L1 to the A node and at the same time to the B node. Since the B node has a low parasitic capacitance, the voltage at the B node rapidly rises above $|V_{th,P2}|$ (where $V_{th,P2}$ is the threshold voltage of P2), and turns P2 "on". In case the voltage at the B node rises too fast above $V_{(C)}+V_{diode}$, before P2 turns "on" (where $V_{diode}$ is the turning on voltage of the source/bulk junction diode of P2 and $V_{(C)}$ is the voltage as node C), the voltage at the B node is immediately discharged towards the C node, and thus avoiding any sustained direct current flow through drain/bulk junction of P2.

As a consequence, the B node and the C node will follow the A node that is rising, driven by P1. Since N2 is turned "on" as well, charge is transferred to the L2 line which, as a result, will be shorted to L1. When the switch 350 is "on" and one side is discharged (e.g. L1), the B node is kept shorted to the A node (since the B node has a low parasitic capacitance), and no forward-bias occurs on the junctions of P1. Further, the bulk of P2 is kept right biased towards the C node, and no issue occurs.

It should be noted that the use of the pass system 310 together with the level shifter 320 in the switch 350 may completely replace the related art pumped switch 100 in FIG. 1.

In particular, the technical effect of N3 transistor of the switch 350 should be noted. That is, provided that P1 and P2 each have a voltage threshold $V_{th,P}$ such that $|V_{th,P}|$ is in the range ~800 mV-1V, voltages lower than this value cannot be passed through N1→P1→P2→N2 path from L1 to L2 without the N3 path. That is, the N3 transistor overcomes the limitations on P1, P2 and ensures that such low voltages can be passed through N3 from L1 to L2.

In addition, an operation of the switch 350 in a step-up program of the matrix 216 in FIG. 2 (e.g., a non-volatile memory array) should be noted.

In a step-up program, a plurality of voltage pulses having different voltage levels are applied to selected word line of the non-volatile memory array. Assume that line L2 which is connected to the switch 350 is coupled through other switches in the READ/WRITE row control system 210 and the row decoder 211 to a word line of the matrix 216, that the supply voltage in the step-up program is 26V, and that line L1 takes 22V which is one of plural step-up voltage levels. In that case, if a selected cell in the matrix 216 to be programmed has not been programmed fully, then line L1 is stepped up to 25V (∠V=3V). That is, the switch 350 may operate as follows:

i) If Line L=22V (i.e., L1 is supplied with a voltage level between 800 mV (the above-mentioned threshold voltage) and 22V), then two paths between L1 and L2 are made with OUT=26V and ENAb=0V; One path is conductive N1→P1→P2→N2 and the other path is conductive N3.

ii) If Line L1 reaches 25V (greater than 22V), then only one path is made with OUT=26V and ENAb=0V. The only one path means the conductive N1→P1→P2→N2 and non-conductive N3. In this view, the related art pumped switch 100 does not make any electrical path between L1 and L2 because N3 is unwillingly rendered non-conductive. If N3 was forced to be conductive by supplying higher voltage than 26V in the related art pumped switch 100, then N3 would be at risk so as to be exposed to the voltage that is over SOA.

Figure 4:
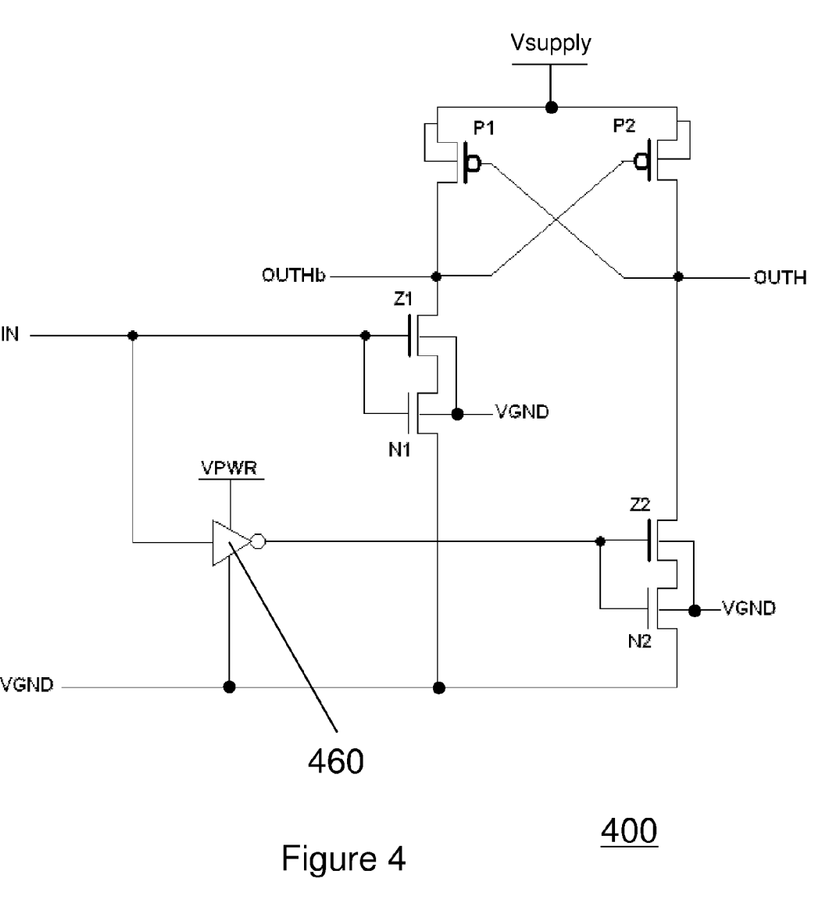
FIG. 4 illustrates a related art level shifter 400.

Referring again to the drawings, FIG. 4 illustrates a related art level shifter 400.

As illustrated in FIG. 4, the related art level shifter 400 includes an input node IN and an output nodes OUTH and OUTHb. The input node IN is coupled to an inverter 460 which is between $V_{PWR}$ and $V_{GND}$.

The level shifter 400 also includes n-ch transistor N1 and high voltage n-ch transistor Z1 which are gated by an input signal at the input node IN, and n-ch transistor N2 and high voltage n-ch transistor Z2 which are gated by the inverted input signal from the inverter 410. The level shifter 400 also includes p-ch transistor P1 having a gate which is coupled to node OUTH, and p-ch transistor P2 having a gate which is coupled to node OUTHb, the transistors P1 and P2 being connected to $V_{supply}$.

A level shifter according to an exemplary aspect of the present invention (e.g., level shifter 320) may have an improved structure and function over the related art level shifter 400 in FIG. 4. A limitation of the related art level shifter 400 of FIG. 4 is that the devices (e.g., components) of the related art level shifter 400 are limited by SOA voltages. Thus, a maximum of $V_{supply}$<SOA limit for $V_{(drain-nwell),pch}$ and $V_{supply}$<SOA limit for $V_{(drain-source),nch}$ is allowed, where $V_{(drain-nwell),pch}$ is the voltage between the drain and the nwell of high voltage p-ch transistors P1 and P2 while V(drain-source),nch is the voltage between the drain and source of high voltage n-ch transistors Z1 and Z2.

For example, assume that the maximum of V(dram-source),nch for the high voltage n-ch transistors Z1 and Z2. is required to be less than 12V. In that case, if the transistor (e.g., Z1 or Z2) drains current, then a maximum of $V_{supply}$ for the related art level shifter 400 will be 12V. This implies that the related art level shifter 400 is inadequate to drive the pass system 310 in FIGS. 3A-3B.

Figure 5A:
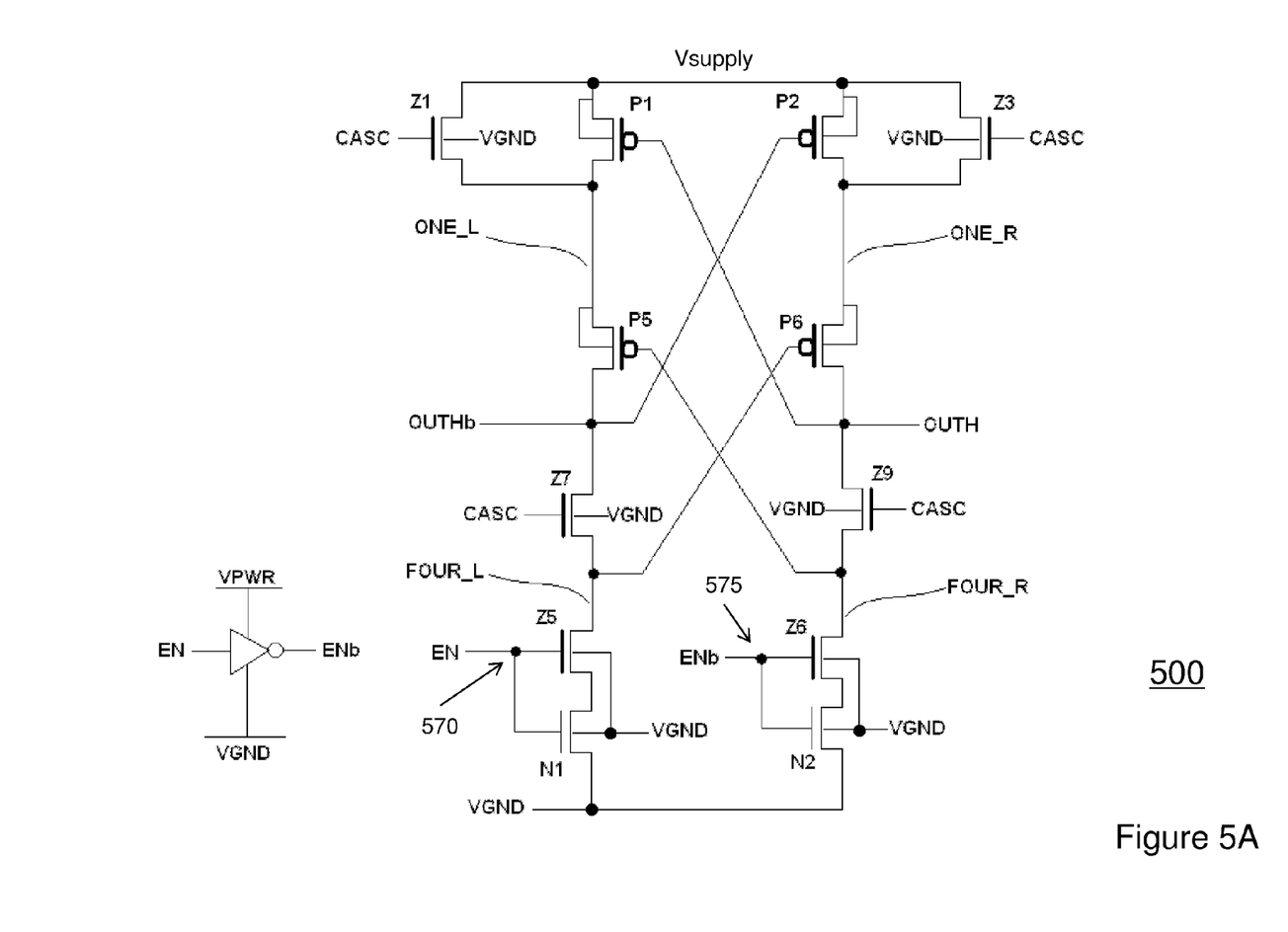
FIG. 5A illustrates a level shifter 500, according to an exemplary aspect of the present invention.
Figure 5B:
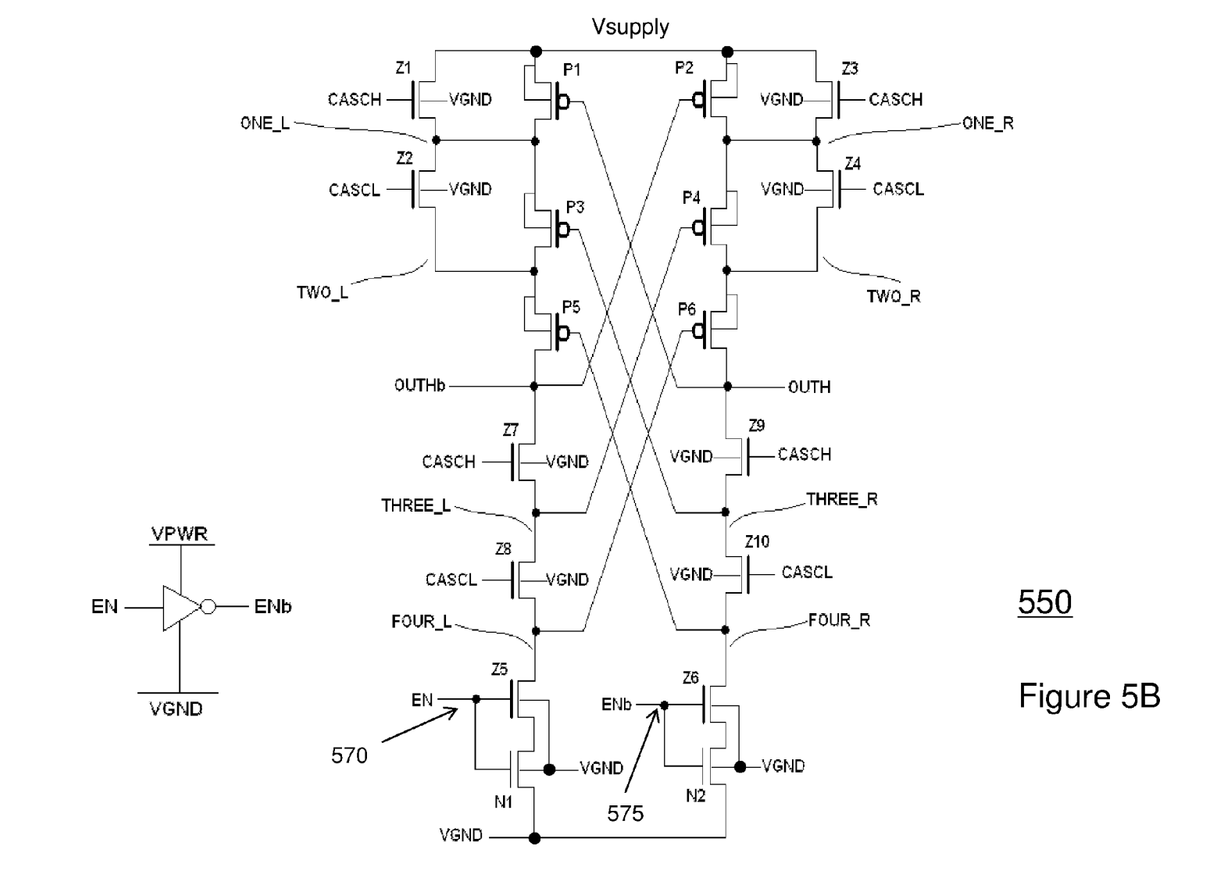
FIG. 5B illustrates a level shifter 550, according to another exemplary aspect of the present invention.

FIG. 5A illustrates a level shifter 500, according to an exemplary aspect of the present invention and FIG. 5B illustrates a level shifter 550, according to another exemplary aspect of the present invention. In particular, FIGS. 5A and 5B may provide a detailed representation of the level shifter 320 (e.g., UHV-el) in FIGS. 3A and 3B.

In particular, the output node OUTH in the level shifters 500 and 550 may correspond to the output node OUT in the level shifter 320. In addition, the level shifters 500 and 550 include a selection node 570 to which a selection signal EN (e.g., ENA in FIG. 3B), and an inverted node 575 to which an inverted signal ENb (e.g., ENAb in FIG. 3B) of the selection signal EN is supplied.

The level shifter 500 may be especially helpful for solving the above-mentioned problem of the related art level shifter 400 in FIG. 4, in the case where a maximum needed supply voltage ($V_{supply}$) is such that there exists the following Condition (A):

$$\text{SOA\_Limit} < V_{Supply} < 2 \times [\text{SOA\_Limit}] \quad \text{Condition (A):}$$

where SOA_Limit is the most restrictive limit in the Safe Operating Area for both the n-ch and p-ch devices in the level shifter 500.

It should be noted that these considerations are related only to static conditions. If transient conditions are taken into account, then the limits on the maximum supply voltage ($V_{supply}$) to make the level shifter 500 work become more restrictive (e.g., values less than 2×[SOA_Limit] are allowed).

In describing the exemplary aspects of the present invention, it should be clear how the threshold voltages and their variations are concerned. A safer limit for the maximum supply voltage ($V_{supply}$ can be taken as $V_{supply} < 2/3 \times 2 \times$ [SOA_Limit]. For the n-ch devices, the SOA_Limit is usually the drain-source voltage ($V_{(drain-source)}$) of the transistor when the transistor is in an "on" state (or when it's being turned "on"). For the p-ch devices, the SOA_Limit is usually the drain-nwell voltage, which is usually greater than SOA_Limit of the n-ch devices. Typical values for the SOA_Limit for n-ch devices and p-ch devices could be 12V and 15V, respectively.

If the case is considered in which $V_{Supply}$ is about 16V, then Condition (A) is satisfied and the level shifter 500 in FIG. 5A could solve the problem of the related art level shifter 400.

Analyzing the features of the level shifter 500 in FIG. 5A, it is noted that numerical values are intended for clarity of exposition only, and not intended to limit any application of the exemplary aspects of the present invention.

The high voltage n-ch transistors Z1, Z3, Z5, Z6, Z7 and Z9 may have a threshold voltage near 0V. In another exemplary aspect, the transistors Z1, Z3, Z5, Z6, Z7 and Z9 could be simply n-ch devices of high-voltage type, without requirements on threshold voltage to be near 0V. The p-ch transistors P1, P2, P5 and P6 are high voltage p-ch transistors, and the n-ch transistors N1 and N2 are low voltage n-ch transistors which are protected from the high voltage world by cascodes Z5 and Z6 that isolate the drains of N1 and N2.

Line CASC may be generated in an external circuit and controlled in order to respect in any condition the following Conditions (B):

$$\text{CASC} < \text{SOA\_limit};$$

$$V_{Supply} - \text{CASC} < \text{SOA\_Limit};$$

and $$\text{CASC} < V_{Supply} \quad \text{Conditions (B):}$$

In a static bias condition, EN=$V_{pwr}$ (same but mirrored for static condition in which EN=0V), N1 and Z5 are in an "on" state, and N2 and Z6 are in an "off" state. Further, Node FOUR_L is tied to $V_{gnd}$, and since Z7 is gated by CASC, node OUTHb is biased at $V_{gnd}$. In addition, since OUTHb gates P2, node ONE_R is tied to supply. Similarly, P6 is similarly gated by FOUR_L (at $V_{gnd}$) and ONE_R is at $V_{Supply}$.

Thus, P6 shorts ONE_R to OUTH. As a result, OUTH is at $V_{Supply}$. P1 is in an OFF state since P1 is gated by OUTH. ONE_L is hence charged by Z1 to CASC (minus $V_{th}$). Because of Z9, FOUR_R is charged to CASC (minus $V_{th}$). P5 is hence in an "off" state as well, since it has source and gate at the same potential.

Further, no current flows between $V_{Supply}$ and $V_{gnd}$. Each one of the n-ch or p-ch devices has a $V_{drain-source}$ and/or $V_{drain-bulk}$ (or $V_{drain-nwell}$) and/or $V_{source-bulk}$ (or $V_{source-nwell}$) which is always within the SOA limits provided Conditions (B) are satisfied. When EN turns from Vpwr to 0V, the commutation of the level shifter 500 is ensured by the fact that the pull down branch (N1, Z5, Z7) is inhibited, while the pull-down of the branch (N2, Z6 and Z9) is enabled. If the strength of the pull-down branches is correctly sized with respect to the pull-up branch (made by the p-ch), no issue occurs. Once the commutation has ended, OUTH is biased at Vgnd and OUTHb is biased at Vsupply, with the bias conditions of the pch and nch transistors P1-P2-P5-P6-Z7-Z9-Z5-Z6 opposite with respect to the case in which EN is at Vpwr. When considering (as mentioned above) threshold voltage and their variations, instead of Conditions (B) it would be safer to consider the more restrictive limits given for instance by Conditions (C):

$$\text{CASC} < 2/3 \times \text{SOA\_limit}$$

$$V_{Supply} - \text{CASC} < 2/3 \times \text{SOA\_Limit}$$

$$\text{CASC} < V_{Supply} \quad \text{Conditions (C):}$$

or something similar to Conditions (C).

Referring to FIG. 5B, the level shifter 550 may have a structure for ensuring that each one of the transistors in the level shifter 550 experiences a maximum $V_{drain-source}$ (e.g., voltage across its drain/source terminal) which is less than the most restrictive voltage limit for SOA, even when Condition (A) is not satisfied. Moreover, when one of the transistors in the level shifter 550 is off, SOA limits for this bias condition are satisfied as well. Without reducing the field of application of the exemplary aspects of the present invention, and only for exposition simplicity purposes only, assume $V_{supply}$=25V, and SOA limitations are as follows:

1. Max $V_{drain-source}$ in ON condition for any high voltage type n-ch transistor=12V
2. Max $V_{drain-source}$ in any bias condition for any high voltage type p-ch transistor=15V
3. Max $V_{drain/bulk junction-source/bulk junction}$ in any condition for any high voltage type n-ch transistor=25V
4. Max $V_{drain/nwell junction-source/nwell junction}$ in any condition for any high voltage type p-ch transistor=15V
5. Max $V_{gate}$ in any condition for any high voltage type n-ch transistor or p-ch transistor=25V The most restrictive limit is hence 12V. Lines CASCH and CASCL are generated in an external circuit and controlled in order to respect in any condition the following Conditions (D):

$$\text{CASCL} = 1/3 V_{Supply} \sim 8V$$

$$\text{CASCH} = 2/3 V_{Supply} \sim 16V \quad \text{Conditions (D):}$$

In the level shifter 550, transistors Z1-Z10 are high voltage n-ch transistors with a threshold voltage near 0V, and transistors P1-P6 are high voltage p-ch transistors. In addition, transistors N1 and N2 are low voltage n-ch transistors, which are protected from the high voltage world by cascodes Z5 and Z6, that isolate the drains of N1 and N2.

Consider, for example, the static bias condition in which EN=$V_{pwr}$V (same but mirrored for static condition in which EN=0V). Transistors N1 and Z5 are in an ON state, and transistors N2 and Z6 are in a OFF state. Node FOUR_L is tied to Vgnd. Since Z8 and Z7 are gated by CASCL and CASCH respectively, node THREE_L and OUTHb are biased at $V_{gnd}$.

Since OUTHb gates P2, node ONE_R is tied to $V_{supply}$. Similarly, P4 is gated by THREE_L (at $V_{gnd}$) and ONE_R is at $V_{Supply}$. Therefore, P4 shorts TWO_R to ONE_R. Finally, P6 is similarly gated by FOUR_L (at $V_{gnd}$) and TWO_R is at $V_{Supply}$. Therefore, P6 shorts TWO_R to OUTH. As a result, OUTH is at $V_{Supply}$. P1 is in an OFF state since it's gated by OUTH. ONE_L is hence charged by Z1 to CASCH (minus $V_{th}$).

Because of Z9, THREE_R is charged to CASCH (minus $V_{th}$). P3 is hence in an OFF state, since its gate and source have the same potential. TWO_L is charged through Z2 to CASCL (minus $V_{th}$). Because of Z10, FOUR_R is charged to CASCL (minus $V_{th}$). P5 is hence in an OFF state as well, since it has source and gate at the same potential.

Thus, no current flows between Supply and Vgnd. Each one of the p-ch or n-ch devices has at maximum $\frac{1}{3}V_{Supply}$ as Vdrain-source and/or Vdrain-bulk (or nwell) and/or Vsource-bulk (or nwell), and SOA is ensured.

When EN turns from Vpwr to 0V, the commutation of the level shifter 550 is ensured by the fact that the pull-down of the branch (N1, Z5, Z8, Z7) is inhibited, whereas the pull-down of the branch (N2, Z6, Z10 and Z9) is enabled. If the strength of the pull-down branches is correctly sized with respect to the pull-up branch (made by the p-ch transistors), no issue occurs.

The max voltage across any device junction is hence Vmax=$\frac{1}{3}\times V_{Supply}$. If the SOA limit of 12V is to be satisfied, in static condition a max $V_{Supply}$ of 36V would be allowable. The problem is that considering temperature variations for the threshold voltages and transient voltage evolutions during commutations, the SOA limit would be in this case infringed. The choice of Conditions (D) make the entire structure of the level shifter 550 safe. Theoretically, the ultimate limit of the structure of the level shifter 550 is the most restrictive between the following conditions, at least for static behavior:

$V_{Supply} < $ Oxide Breakdown Voltage  Condition E:

$\frac{1}{3} \times V_{Supply} < $ Most restrictive SOA_limit for junction breakdown  Condition F:

When transients are taken into account, Condition F becomes more restrictive and it would be safer to replace it with the following:

$\frac{1}{3} \times V_{Supply} < \frac{2}{3} \times $(Most restrictive SOA_limit for junction breakdown) which leads to Conditions (D).  Condition G:

Depending on the $V_{A,max}$ voltage that has to be passed across the switch 300 (or switch 350), from line L1 to line L2, one of the two implementations of the level shifter 500 or level shifter 550 can be chosen. If Condition (A) is not satisfied, then the level shifter 550 in FIG. 5B may be selected. A correct sizing of the structures (e.g., using level shifter 500 or level shifter 550) may ensure a proper operation in the whole range $V_{pwr}-(V_{A,max}+V_{th,N1})$ for the $V_{Supply}$ voltage, provided Conditions (C) or (D) are satisfied for CASC or (CASCH and CASCL).

The result is that without DC current consumption, the level shifter 500 and the level shifter 550 can switch between 0 and $V_{Supply}$, $V_{Supply}$ being greater than the SOA limits for breakdown of the junctions of the transistors in the low-threshold pass system 310 in the exemplary aspects of the present invention.

No particular concerns on the layout side exist for the OUTH and OUTHb nodes in the level shifter 550, since these nodes can be always charged (when needed) to $V_{Supply}$ voltage, even if the capacitive load on these nodes is in the range of some pF without any effect similar to the "pumping efficiency loss" of the related art pumped switch 100 in FIG. 1.

The "turning on" timing may depend only on capacitive load on the OUTH and OUTHb nodes. That is, there is no need for "pumping timings". Basically, the structure of the level shifter 550 may be similar to a "ultra-high voltage" inverter.

When used together with the low-threshold pass-system 310 in FIG. 3A or 3B, the level shifter 550 may ensure a compact ultra-high-voltage switching system with less area occupation than the related art pumped switch 100 in FIG. 1.

Figure 6:
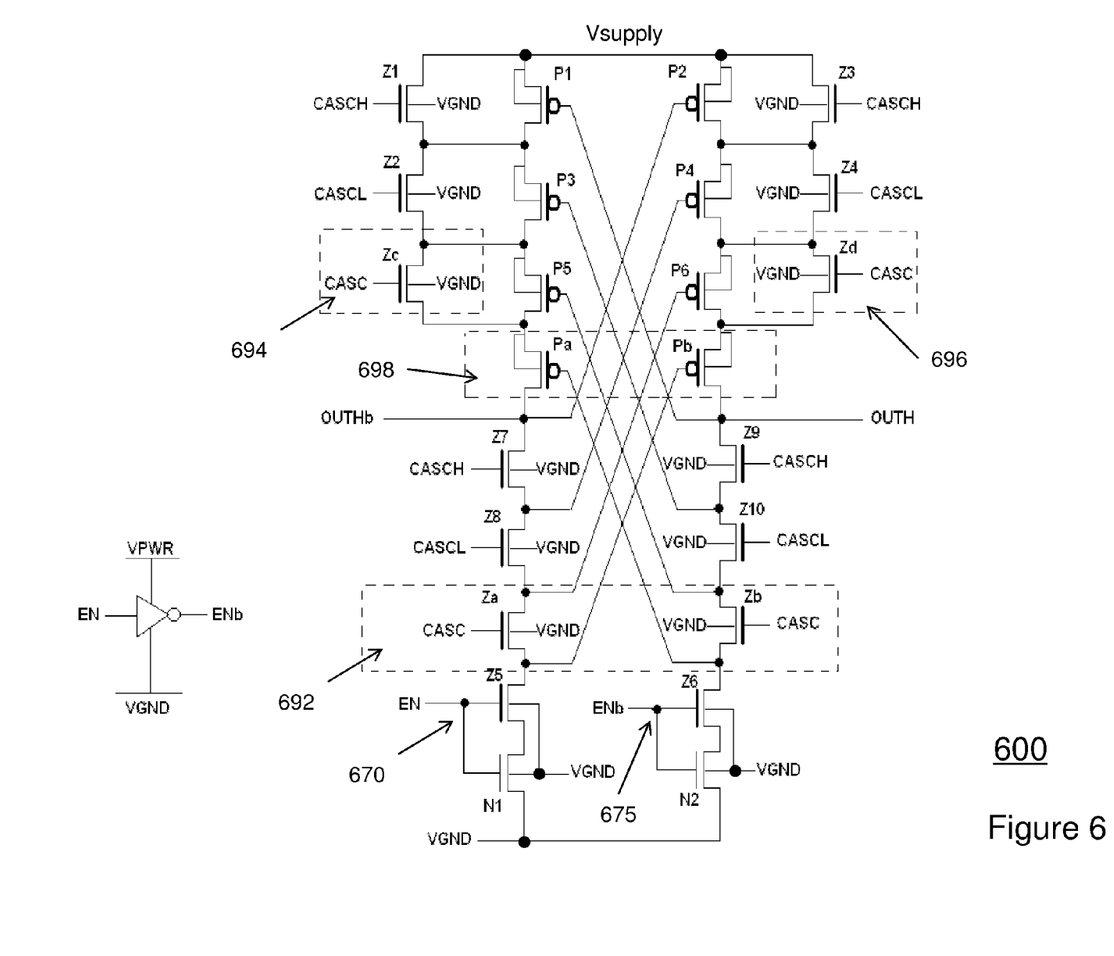
FIG. 6 illustrates a level shifter 600, according to another exemplary aspect of the present invention.

FIG. 6 illustrates a level shifter 600, according to another exemplary aspect of the present invention.

In particular, the output node OUTH in the level shifter 600 may correspond to the output node OUT in the level shifter 320. In addition, the level shifter 600 includes a selection node 670 to which a selection signal EN (e.g., ENA in FIG. 3B), and an inverted node 675 to which an inverted signal ENb (e.g., ENAb in FIG. 3B) of the selection signal EN is supplied.

As illustrated in FIG. 6, as an extension of the level shifter 320 in FIG. 3B, the level shifter 600 may provide a structure that overcomes Condition (G), provided that Condition (E) is satisfied.

Basically, in the level shifter 600, another (latch+cascode+bias) stage has been added to the level shifter 550 in FIG. 5B. That is, in addition to the features of the level shifter 550, the level shifter 600 includes a circuit portion 692 including high voltage n-ch transistors Za and Zb, circuit portion 694 including high voltage n-ch transistor Zc, circuit portion 696 including high voltage n-ch transistor Zd, and circuit portion 698 including p-ch transistors Pa and Pb.

Thus, in the level shifter 600, the Condition (G) becomes now the following Condition (H):

$\frac{1}{4} \times V_{Supply} < \frac{2}{3} \times $(Most restrictive SOA_limit for junction breakdown)  Condition (H)

Similarly, provided that Condition (E) is satisfied, the exemplary aspects of the present invention includes a procedure of adding additional (latch+cascode+bias) stages to the level shifter 600 to form additional level shifters, each additional level shifter experiencing a max junction voltage equal to $V_{max}=1/n \times V_{Supply}$, where $1/n V_{Supply} < \frac{2}{3} \times $(Most restrictive SOA_limit for junction breakdown).

Figure 7:
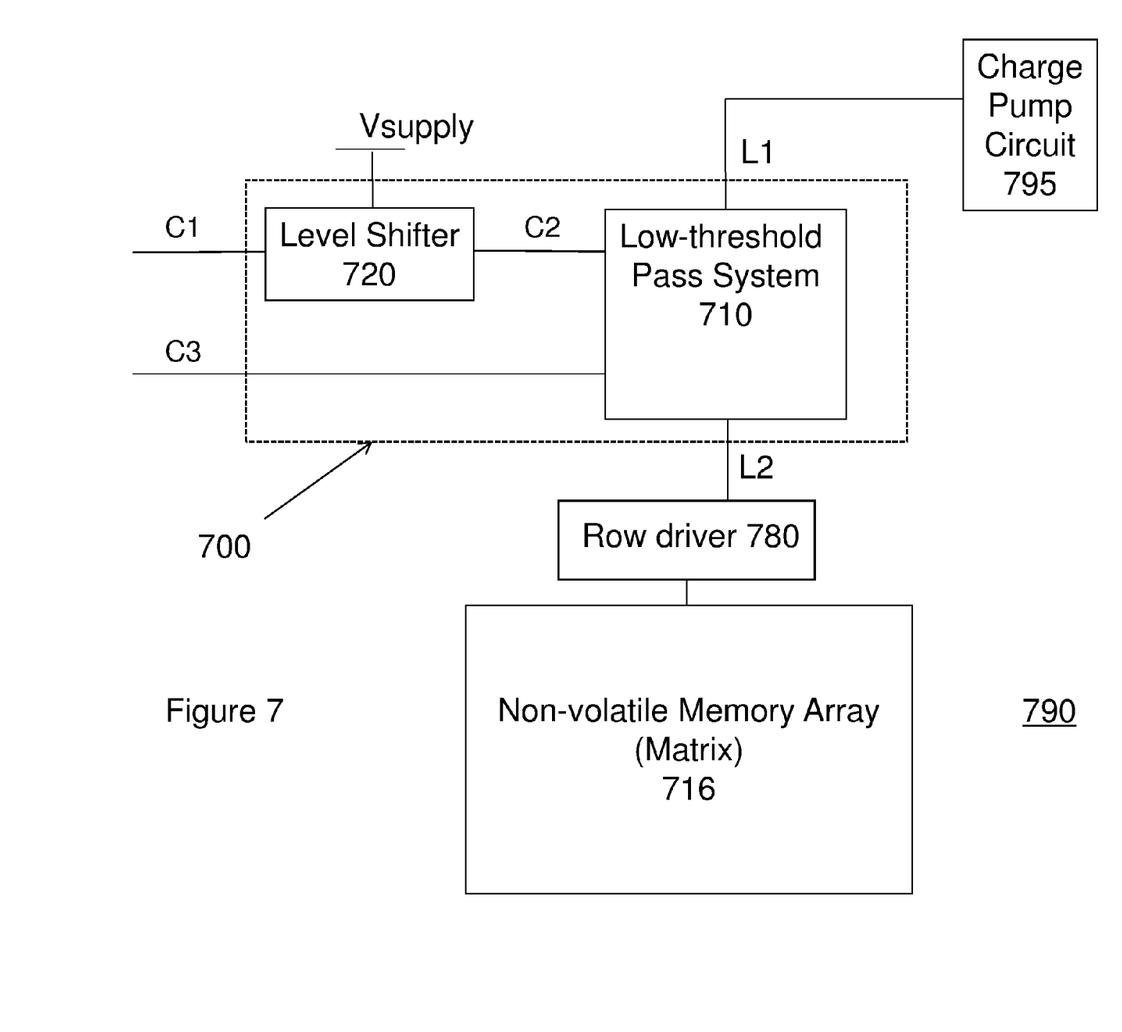
FIG. 7 illustrates a device 790, according to another exemplary aspect of the present invention.

FIG. 7 illustrates a device 790, according to another exemplary aspect of the present invention.

As illustrated in FIG. 7, the device 790 includes a non-volatile memory array (e.g., matrix) 716, an internal line (L2) coupled to the non-volatile memory array 716, and a voltage line (L1) configured to take at least first and second voltage levels (e.g., the first voltage level being greater than the second voltage level) in a program of the non-volatile memory array 716, the first and second voltage levels being different from each other.

The device 790 may also include a row driver 780 which may intervene between the internal line (L2) and the non-volatile memory array 716 as shown in FIG. 7. The row driver 780 may correspond to the row decoder 211 in FIG. 2 and drive appropriate voltages to be supplied to word lines of the non-volatile memory array 716.

The device 790 may also include a switch 700 (e.g., the switch 300 or switch 350) which includes a low-threshold pass system 710 and a level shifter 720 for controlling the low-threshold pass system 710.

In particular, the low-threshold pass system 710 may include a first circuit configured to produce a first electrical path (e.g., the N1→P1→P2→N2 path in FIG. 3B) from the voltage line (L1) to the internal line (L2) in response to a selection signal (e.g., ENA in FIG. 3B), and a second circuit configured to produce a second electrical path (e.g., the N3 path in FIG. 3B) connecting from the voltage line (L1) to the internal line (L2) in response to the selection signal. One of the first and second electrical paths may be produced when the voltage line (L1) takes the first voltage level, and both of the first and second electrical paths may be produced when the voltage line (L1) take the second voltage level.

In particular, the first circuit may include a first transistor (e.g., N1 in FIG. 3B) coupled between the voltage line (L1) and the internal line (L2) and including a control gate supplied with a control signal, and the second circuit may include a second transistor (e.g., N3 in FIG. 3B) (e.g., having a threshold voltage greater than a threshold voltage of the first transistor (N1)) coupled between the voltage line (L1) and the internal line (L2) and including a control gate supplied with the control signal, the first and second transistors (N1, N3) being the same in a channel type as each other, the first and second transistor being different in threshold voltage from each other.

The first circuit may further include a third, fourth and fifth transistors (e.g., P1, P2 and N2, respectively, in FIG. 3B) in series inserted between the first transistor (N1) and the internal line (L1), the third transistor (P1) including a control gate supplied with a second control signal (e.g., ENAb in FIG. 3B), the fourth transistor (P2) including a control gate supplied with the second control signal, the fifth transistor (N2) including a control gate supplied with the first control signal, the third and fourth transistors (P1, P2) being different in a channel type from the first and second transistors (N1, N3), and the fifth transistor (N2) being the same in a channel type as the first and second transistors (N1, N3).

The device 790 may also include a charge pump circuit 795 supplying a voltage to the voltage line (L1), the voltage being in a voltage range having the first and second voltage levels.

With its unique and novel features, the exemplary aspects of the present invention may provide a device (e.g., switch) which may drastically reduce area and power consumption, and that can be easily driven during memory operations, without time wasting during turning on and off transistors, and with no particular layout concerns.

While the invention has been described in terms of one or more embodiments, those skilled in the art will recognize that the invention can be practiced with modification within the spirit and scope of the appended claims. Specifically, one of ordinary skill in the art will understand that the drawings herein are meant to be illustrative, and the design of the inventive assembly is not limited to that disclosed herein but may be modified within the spirit and scope of the present invention.

Further, Applicant's intent is to encompass the equivalents of all claim elements, and no amendment to any claim the present application should be construed as a disclaimer of any interest in or right to an equivalent of any element or feature of the amended claim.

What is claimed is:

1. A device for use with non-volatile memory, the device comprising:
a first transistor of a first channel type coupled between first and second nodes, including a control gate supplied with a first control signal having a first phase;
a second transistor of a second channel type different from the first channel type including a first terminal coupled to the first node, a second terminal coupled to a third node, a back gate connected to the first terminal thereof, and a control gate supplied with a second control signal having a second phase substantially opposite to the first phase;
a third transistor of the second channel type including a first terminal coupled to the second node, a second terminal coupled to the third node, a back gate connected to the first terminal thereof, and a control gate supplied with the second control signal; and
a protection circuit coupled between the first and second node so that the protection circuit, the second transistor and the third transistor are connected in series, the protection circuit being supplied with the first control signal.

2. The device as claimed in claim 1, further comprising:
an elevator circuit configured to shift a voltage level of an input signal to produce the first control signal.

3. The device as claimed in claim 2, further comprising:
an inverter configured to receive the input signal to produce the second control signal.

4. The device as claimed in claim 1, wherein the protection circuit comprises:
a fourth transistor of the first channel type coupled between the first node and the first terminal of the second transistor; and
a fifth transistor of the first channel type coupled between the second node and the first terminal of the third transistor,
wherein the first transistor including a first threshold voltage, and
wherein the fourth and fifth transistors each includes a second threshold voltage lower than the first threshold voltage.

5. The device as claimed in claim 4, further comprising:
a non-volatile memory array coupled to the second node.

6. The device as claimed in claim 1, wherein the back gate of the second transistor is constantly connected to the first terminal thereof, and the back gate of the third transistor is constantly connected to the second terminal thereof.

7. A device for use with non-volatile memory, the device comprising:
a first transistor of a first channel type coupled between first and second nodes, including a control gate supplied with a first control signal having a first phase;
a second transistor of a second channel type different from the first channel type including a first terminal coupled to the first node, a second terminal coupled to a third node, a back gate coupled to the first terminal thereof, and a control gate supplied with a second control signal having a second phase substantially opposite to the first phase;
a third transistor of the second channel type including a first terminal coupled to the second node, a second terminal coupled to the third node, a back gate coupled to the first terminal thereof, and a control gate supplied with the second control signal; and
a protection circuit coupled between the first and second node so that the protection circuit, the second transistor and the third transistor are connected in series, the protection circuit being supplied with the first control signal, wherein the protection circuit comprises:
a fourth transistor of the first channel type coupled between the first node and the first terminal of the second transistor; and a fifth transistor of the first channel type coupled between the second node and the first terminal of the third transistor, wherein the first transistor including a first threshold voltage, and wherein the fourth and fifth transistors each includes a second threshold voltage lower than the first threshold voltage.

8. The device as claimed in claim 7, further comprising:
an elevator circuit configured to shift a voltage level of an input signal to produce the first control signal.

9. The device as claimed in claim 7, further comprising:
an inverter configured to receive the input signal to produce the second control signal.

* * * * *